(12) United States Patent
Lee et al.

(10) Patent No.: US 9,208,875 B2
(45) Date of Patent: Dec. 8, 2015

(54) RESISTIVE NONVOLATILE MEMORY DEVICE HAVING CELLS PROGRAMMED TO ACHIEVE A TARGET RESISTANCE VALUE AT A TARGET TIME AND WRITING METHOD THEREOF

(71) Applicant: Samsung Electronics Co., Ltd., Suwon-si (KR)

(72) Inventors: Kwang-Woo Lee, Hwaseong-si (KR); Daewon Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 44 days.

(21) Appl. No.: 14/162,991

(22) Filed: Jan. 24, 2014

(65) Prior Publication Data

US 2014/0219014 A1    Aug. 7, 2014

(30) Foreign Application Priority Data

Feb. 5, 2013    (KR) .................. 10-2013-0013035

(51) Int. Cl.
*G11C 13/00*     (2006.01)
*G11C 11/56*     (2006.01)

(52) U.S. Cl.
CPC ............ *G11C 13/0069* (2013.01); *G11C 11/56* (2013.01); *G11C 11/5678* (2013.01); *G11C 13/0002* (2013.01); *G11C 13/0004* (2013.01); *G11C 13/0061* (2013.01); *G11C 13/0064* (2013.01)

(58) Field of Classification Search
CPC ........... G11C 13/0002; G11C 13/0061; G11C 13/0069; G11C 13/0004; G11C 13/0064; G11C 11/5678; G11C 11/56
See application file for complete search history.

(56) References Cited

U.S. PATENT DOCUMENTS

| | | | |
|---|---|---|---|
| 7,423,901 B2 * | 9/2008 | Sutardja | 365/163 |
| 7,471,543 B2 | 12/2008 | Nakashima et al. | |
| 7,495,984 B2 | 2/2009 | Kim et al. | |
| 7,573,758 B2 | 8/2009 | Park et al. | |
| 7,639,522 B2 | 12/2009 | Cho et al. | |
| 7,639,526 B2 | 12/2009 | Pellizzer et al. | |
| 7,773,410 B2 | 8/2010 | Sheu et al. | |
| 7,916,515 B2 | 3/2011 | Li et al. | |
| 7,929,338 B2 | 4/2011 | Franceschini et al. | |
| 7,969,798 B2 | 6/2011 | Hwang et al. | |
| 8,184,470 B2 * | 5/2012 | Toda et al. | 365/148 |
| 8,194,473 B2 | 6/2012 | Shin et al. | |
| 8,199,567 B2 | 6/2012 | Chang-Wook et al. | |
| 8,315,089 B2 | 11/2012 | Kang et al. | |
| 2010/0182825 A1 * | 7/2010 | Lowrey et al. | 365/163 |
| 2012/0069681 A1 | 3/2012 | Oikawa | |
| 2013/0163321 A1 * | 6/2013 | Lam et al. | 365/163 |

\* cited by examiner

*Primary Examiner* — Vanthu Nguyen
(74) *Attorney, Agent, or Firm* — Myers Bigel Sibley & Sajovec, P.A.

(57) ABSTRACT

A writing method of a nonvolatile memory device is provided which receiving data, a target time, and a target resistance value; writing the data at a memory cell; calculating a resistance drift coefficient based on resistance values of the memory cell read on at least two times; calculating a resistance value of the memory cell on the target time using the resistance drift coefficient; and determining whether the resistance value calculated satisfies the target resistance value.

19 Claims, 8 Drawing Sheets

RESISTIVE NONVOLATILE MEMORY DEVICE HAVING CELLS PROGRAMMED TO ACHIEVE A TARGET RESISTANCE VALUE AT A TARGET TIME AND WRITING METHOD THEREOF

CROSS-REFERENCE TO RELATED APPLICATION

The present application claims priority under 35 U.S.C. §119 to Korean Patent Application No. 10-2013-0013035, filed Feb. 5, 2013 in the Korean Intellectual Property Office, the entire content of which is hereby incorporated herein by reference.

BACKGROUND

The inventive concepts described herein relate to nonvolatile memory devices and to methods of writing data to nonvolatile memory devices.

Memory devices that store data using a resistance material include phase change random access memories (PRAM), resistive RAMs (RRAM), ferroelectric RAMs (FRAM), magnetic RAMs (MRAM), and so on. A DRAM or a flash memory may store data using charges, while a nonvolatile memory device using a resistance material may store data using a phase variation in a phase change material such as chalcogenide alloy (e.g., PRAM), a resistance variation of a variable resistance material (e.g., RRAM), a polarization characteristic of a ferroelectric material (FRAM), a resistance variation in a magnetic tunnel junction (MTJ) film according to a magnetization state of a ferromagnetic material (MRAM), and so on.

SUMMARY

One aspect of embodiments of the inventive concept is directed to a method of writing data to a nonvolatile memory device comprising receiving the data, a target time, and a target resistance value; writing the data to a memory cell; measuring the resistance value of the memory cell at two or more different times; calculating a resistance drift coefficient based on the measured resistance value of the memory cell; calculating a predicted resistance value of the memory cell at the target time using the resistance drift coefficient; and determining whether the predicted resistance value satisfies the target resistance value.

In example embodiments, the memory cell includes a resistance material.

In example embodiments, the resistance value R of the memory cell satisfies the following equation:

$$R = R_0 (t/t_0)^d$$

where $R_0$, $t_0$, t, and d indicate an initial resistance value, an initial time, a time at which the resistance value R is determined, and the resistance drift coefficient, respectively.

In example embodiments, the memory cell is a phase change memory cell.

In example embodiments, writing the data to a memory cell comprises setting the resistance value of the memory cell to a first of a plurality of data states based on a value of the input data, at least one reference resistance state being used to distinguish between the plurality of data states.

In example embodiments, determining whether the predicted resistance value satisfies the target resistance value comprises determining whether the predicted resistance value is within a predetermined range of the target resistance value.

In example embodiments, the writing method further comprises determining whether a write loop number reaches a maximum write loop number when the predicted resistance value does not satisfy the target resistance value.

In example embodiments, the writing method further comprises determining whether the predicted resistance value does not satisfy the target resistance value when the write loop number does not reach the maximum write loop number.

In example embodiments, the writing method further comprises decreasing a current or voltage applied to the memory cell during a subsequent programming loop for the memory cell in response to the predicted resistance value exceeding the target resistance value.

In example embodiments, the writing method further comprises increasing a current or voltage applied to the memory cell during a subsequent programming loop for the memory cell in response to the predicted resistance value being less than the target resistance value.

Another aspect of embodiments of the inventive concept is directed to provide a nonvolatile memory device which comprises a memory cell array including memory cells connected to word lines and bit lines; a bit line selection circuit configured to select a subset of the bit lines; a write driver circuit configured to apply a bit line voltage or current, corresponding to input data, to memory cells connected to a selected one of the word lines through the bit line selection circuit during a write operation; a sense amplifier circuit configured to read written data through the selected bit lines from the memory cells connected to the selected word line using reference cells corresponding to target states at a verification operation; and control logic configured to control the bit line selection circuit, the write driver circuit, and the sense amplifier circuit at the write operation or at the verification operation, wherein the control logic controls the write operation such that resistance values of the memory cells and the reference cells converge on a target resistance value at a target time.

In example embodiments, the reference cells are connected to the selected word line.

In example embodiments, at the write operation, the target time and the target resistance value are provided from an external device.

In example embodiments, a target resistance drift coefficient is received from an external device at the write operation and the control logic controls the nonvolatile memory device to set a resistance drift coefficient for each of the memory cells to the target resistance drift coefficient.

Still another aspect of embodiments of the inventive concept are directed to a method of writing data to a nonvolatile memory device comprising writing the data to a memory cell of the nonvolatile memory device; performing a first verification operation on the memory cell using resistance values read from the memory cell at different times; and performing a second verification operation on the memory cell using a predicted future resistance value of the memory cell that is predicted based on a result of the first verification operation.

Still another aspect of embodiments of the inventive concept is directed to a method of programming a nonvolatile memory device in which the resistance of a memory cell is are measured at two or more different times. Then, a resistance drift coefficient for the memory cell is calculated based on the measured resistances.

In example embodiments, data is written to the memory cell before the resistance of the memory cell is measured.

In example embodiments, the method for may further include determining a predicted resistance value for the memory cell at a target time based at least in part on the calculated resistance drift coefficient for the memory cell.

In example embodiments, the method may further include adjusting the resistance of the memory cell if the predicted resistance value at the target time falls outside a predetermined range.

In example embodiments, adjusting the resistance of the memory cell if the predicted resistance at the target time falls outside the predetermined range may comprise increasing a write voltage or current supplied to the memory cell if the predicted resistance value at the target time exceeds the target resistance value.

In example embodiments, adjusting the resistance of the memory cell if the predicted resistance at the target time falls outside the predetermined range may comprise decreasing a write voltage or current supplied to the memory cell if the predicted resistance value at the target time is less than the target resistance value.

In example embodiments, the method may further include determining if the calculated resistance drift coefficient for the memory cell at the target time is within a predetermined range of a target resistance drift coefficient at the target time.

Still another aspect of embodiments of the inventive concept is directed to a method of programming a nonvolatile memory device in which control logic is used to control a write operation during which data is written to a memory cell array of the nonvolatile memory device so that resistance values of memory cells and reference cells of the memory cell array converge on a target resistance value at a target time.

Yet another aspect of embodiments of the inventive concept is directed to a method of programming a nonvolatile memory device comprising: writing data to a memory cell of the nonvolatile memory device; determining a predicted resistance value at a target time based on resistance values measured at two or more different points of time during a program verification operation; and adjusting the time for which a programming voltage or current is applied to the memory cell during a subsequent programming loop based at least in part on the determined predicted resistance values.

In example embodiments, the method may further include calculating a resistance drift coefficient for the memory cell based on the measured resistance values.

In example embodiments, the operation of adjusting the time for which the programming voltage or current is applied to the memory cell during the subsequent programming loop based at least in part on the determined predicted resistance values is performed in response to a determination that the predicted resistance value at the target time falls outside a predetermined range.

BRIEF DESCRIPTION OF THE FIGURES

The above and other objects and features will become apparent from the following description with reference to the following figures, wherein like reference numerals refer to like parts throughout the various figures unless otherwise specified. In the figures.

DETAILED DESCRIPTION

Figure 1:
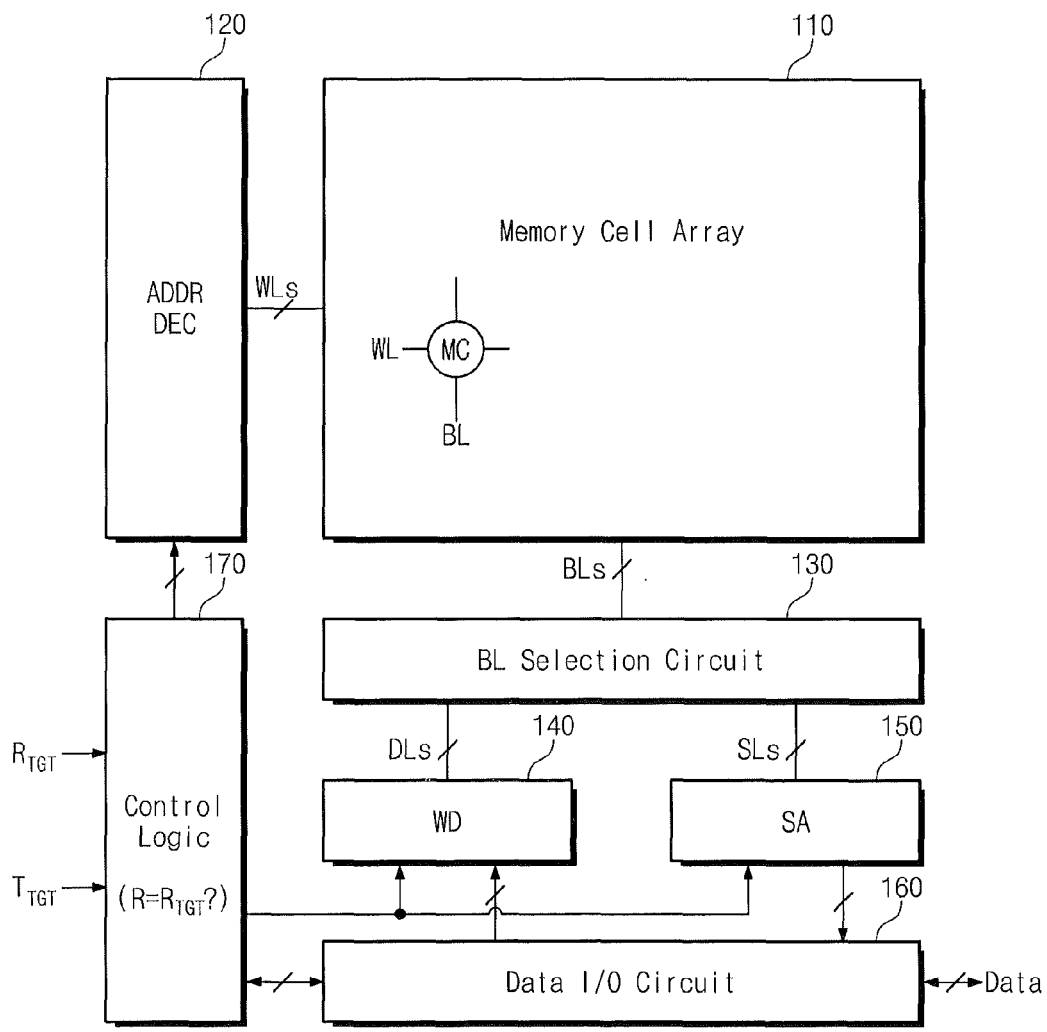
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited to the illustrated embodiments. Rather, these embodiments are provided as examples so that this disclosure will be thorough and complete, and will fully convey the inventive concept to those skilled in the art. Accordingly, known processes, elements, and techniques are not described with respect to some of the embodiments of the inventive concept. Unless otherwise noted, like reference numerals denote like elements throughout the attached drawings and written description.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device 100 according to an embodiment of the inventive concepts. Referring to FIG. 1, the nonvolatile memory device 100 may include a memory cell array 110, an address decoder 120, a bit line selection circuit 130, a write driver circuit 140, a sense amplifier 150, a data input/output circuit 160, and control logic 170.

The memory cell array 110 may be connected to the address decoder 120 through word lines, and to the bit line selection circuit 130 through bit lines. The memory cell array 110 may include a plurality of memory cells. As illustrated in FIG. 1, the memory cells MC may be located at intersection of a word line and a bit line. Each memory cell MC may store at least one bit of data using a resistance material.

The address decoder 120 may be configured to operate in response to control signals from the control logic 170. The address decoder 120 may receive an address ADDR from an external device.

The address decoder 120 may be configured to decode a row address of the input address ADDR that is input from the external device. The address decoder 120 may select a word line using the decoded row address. The address decoder 120 may be configured to decode a column address of the input address ADDR. The decoded column address may be transferred to the bit line selection circuit 130. In example embodiments, the address decoder 120 may include components such as a row decoder, a column decoder, an address buffer, and so on.

The bit line selection circuit 130 may be connected to the memory cell array 110 through the bit lines, and may also be connected to the write driver circuit 140 and the sense amplifier 150. The bit line selection circuit 130 may operate in response to control signals from the control logic 170. The bit line selection circuit 130 may be configured to receive the decoded column address from the address decoder 120. The bit line selection circuit 130 may select bit lines using the decoded column address. For example, during a program operation, the bit line selection circuit 130 may connect the bit lines to the write driver circuit 140. During a read operation, the bit line selection circuit 130 may connect the bit lines to the sense amplifier 150.

The write driver circuit 140 may operate in response to control signals from the control logic 170. The write driver circuit 140 may be configured to program the memory cells MC that are connected to the bit lines selected by the bit line selection circuit 130 and that are connected to a word line selected by the address decoder 120. The write driver circuit 140 may generate a current or voltage according to data input from the data input/output circuit 160, and may output the current or voltage to the selected bit lines via the bit line selection circuit 130.

The sense amplifier 150 may operate in response to control signals from the control logic 170. The sense amplifier 150 may be configured to read memory cells MC that are connected to the bit lines that are selected by the bit line selection circuit 130 and that are connected to a word line that is selected by the address decoder 120. The sense amplifier 150 may sense currents flowing through the selected bit lines or voltages applied to the selected bit lines to read memory cells. The sense amplifier 150 may output the read data to the data input/output circuit 160.

The data input/output circuit 160 may operate in response to control signals from the control logic 170. The data input/output circuit 160 may transfer externally input data to the write driver circuit 140 and may transfer data provided from the sense amplifier 150 to an external device.

The control logic 170 may control the overall operation of the nonvolatile memory device 100. The control logic 170 may operate in response to command or control signals provided from the external device.

The control logic 170 may be implemented such that a multi-bit write operation is possible. As part of the multi-bit write operation, the control logic 170 may receive a target resistance value $R_{TGT}$ and a target time $T_{TGT}$, from, for example, an external device. During the multi-bit write operation, the control logic 170 may check whether a resistance value of a memory cell MC satisfies the target resistance value $R_{TGT}$ at the target time $T_{TGT}$. In some embodiments, the control logic 170 may control the memory device 100 so that a resistance value of a memory cell that data was written to will converge toward the target resistance value $R_{TGT}$ at the target time $T_{TGT}$.

In example embodiments, a resistance value R of a memory cell at the target time $T_{TGT}$ may be determined by a resistance drift function. The resistance drift function may relate to a resistance value and a time. For example, the resistance drift function R may satisfy the following equation.

$$R = R_0 \left(\frac{t}{t_0}\right)^d \quad (1)$$

In equation 1, "$R_0$" may indicate an initial resistance value, "$t_0$" may indicate an initial time, "d" may indicate a resistance drift coefficient, and "t" may indicate a time lapse from the initial time $t_0$.

In example embodiments, the resistance drift coefficient d may be calculated by reading a resistance value of a memory cell at two or more different points of time.

In a conventional nonvolatile memory device, the resistance values of programmed memory cells may drift over time. As the resistance values of memory cells drift over time, the distribution of the resistance values of the memory cells may be increased. Such an increase in the distribution of resistance values of the memory cells may reduce the reliability of data stored in the memory cells.

In contrast, the nonvolatile memory device 100 according to an embodiment of the inventive concept may perform a write operation that takes into account the drift of the resistance value over time by verifying whether a resistance value of a memory cell is expected to satisfy the target resistance value $R_{TGT}$ at the target time $T_{TGT}$. As compared to a conventional nonvolatile memory device, the nonvolatile memory device 100 according to an embodiment of the inventive concept may improve the reliability of data stored in the memory cells.

In order to improve programming reliability, a conventional nonvolatile memory device that uses variable resistance memory cells to store data may perform a program verify operation as part of the program operation. In particular, the nonvolatile memory device may run iterative programming loops that increase the program current on a step by step basis while performing the program and program verify operations.

During each program loop, the program verify operation is performed following a program operation. According to a program verification result obtained by the program verify operation, the program current is increased if the memory cell programming fails. Following this increase in program current, another program loop operation is run. This iterative loop continues until the selected memory cell(s) are properly programmed (a "pass" condition). The use of such an iterative programming loop approach may improve the reliability of program data.

Nonvolatile memory device that uses variable resistance memory cells to store data do not iteratively accumulate, for example, a phase state (that defines a resistance) over the sequence of programming loops directed to the memory cell. That is, the results of a previous program loop does not influence a current program loop for the nonvolatile memory device. Instead, each programming loop independently defines the desired phase state for the selected memory cell(s), or not—albeit with an increasing current or voltage value. This differs from the programming operation for conventional flash memory devices which iteratively accumulate charge over the sequence of programming loops directed to the memory cell.

Figure 2A:
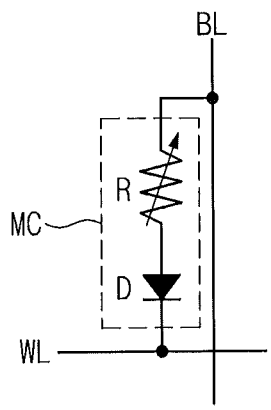
FIGS. 2A to 2C show memory cells according to various embodiments of the inventive concept.
Figure 2B:
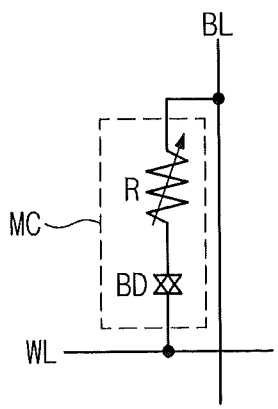
Figure 2C:
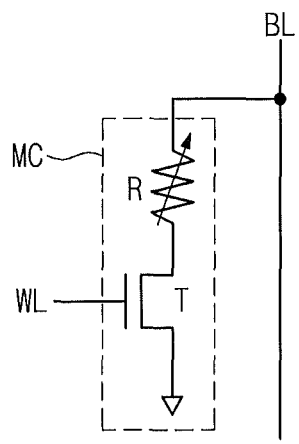

The memory cell MC in FIG. 1 may comprise a variable resistance memory cell. FIGS. 2A to 2C schematically show memory cells according to various embodiments of the inventive concept.

Referring to FIG. 2A, a memory cell MC may include a variable resistor R and a diode D. In example embodiments, the variable resistor R may be formed of a phase change material. For example, the phase change material may be a GST (Ge—Sb—Te) material. The diode D may be interposed between the variable resistor R and a word line. Referring to FIG. 2B, in other embodiments, the memory cell MC may be formed of a variable resistor R and a bidirectional diode BD. The bidirectional diode BD may be interposed between the variable resistor R and a word line. Referring to FIG. 2C, in still other embodiments, the memory cell MC may be formed of a variable resistor R and a transistor T. The gate of the transistor T may be connected to a word line. It will be appreciated that the structure of a memory cell MC of the inventive concept is not be limited to structures in FIGS. 2A to 2C.

The nonvolatile memory device 100 according to an embodiment of the inventive concept may use a reference cell scheme for a write/read operation. Example reference cell schemes are disclosed in U.S. Pat. Nos. 8,050,084; 8,174, 865; and 8,116,117, the entire contents of which are hereby incorporated by reference herein.

Figure 3:
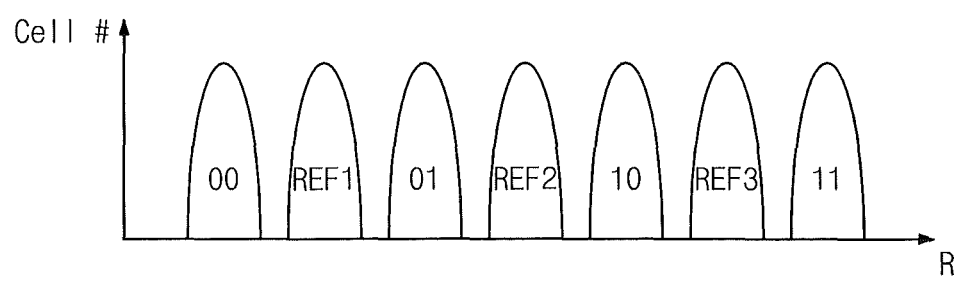
FIG. 3 is a diagram schematically illustrating a resistance distribution when a memory cell of FIG. 1 stores 2-bit data according to a reference cell scheme.

FIG. 3 is a diagram schematically illustrating a resistance distribution when a memory cell MC of memory cell array 110 of FIG. 1 stores 2-bit data according to a reference cell scheme. Referring to FIG. 3, a resistance distribution may be formed that includes four data states '00', '01', '10', and '11' and three reference resistance states 'REF1', 'REF2', and 'REF3' that may be used to distinguish the data states '00', '01', '10', and '11'. That is, seven program states may be used to express 2-bit data.

Figure 4:
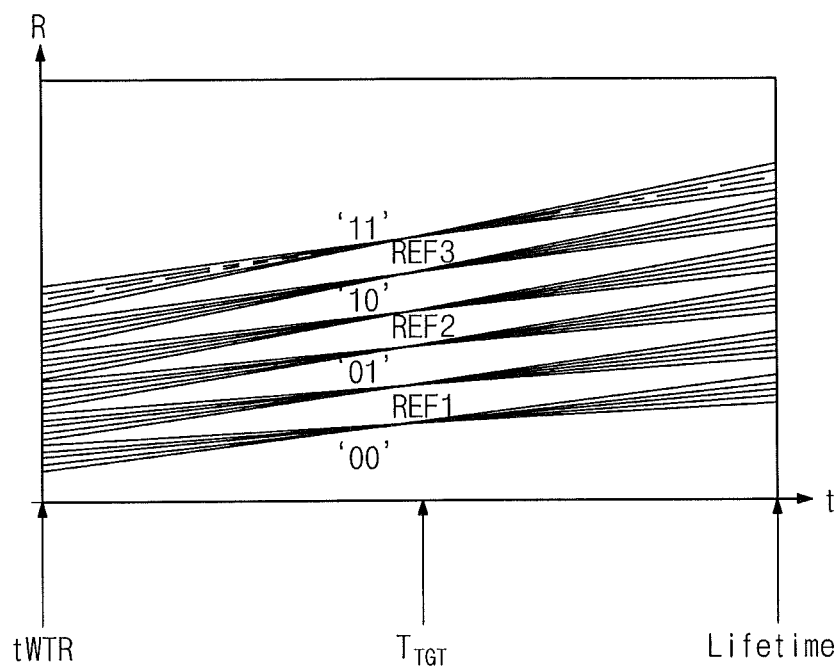
FIG. 4 is a diagram schematically illustrating variations in program states as a function of time in a nonvolatile memory device according to the inventive concept.

FIG. 4 is a diagram that schematically illustrates variations in program states over time in the nonvolatile memory device 100 according to the inventive concept. Referring to FIG. 4, resistance values of program states '00', '01', '10', '11', 'REF1', 'REF2', and 'REF3' may converge until a target time TTGT, and may diverge after the target time TTGT.

In example embodiments, resistance values of the program states '00', '01', '10', '11', 'REF1', 'REF2', and 'REF3' may be distinguishable at a write time tWTR.

In example embodiments, resistance values of the program states '00', '01', '10', '11', 'REF1', 'REF2', and 'REF3' may converge until the target time $T_{TGT}$.

In example embodiments, resistance values of the program states '00', '01', '10', '11', 'REF1', 'REF2', and 'REF3' may diverge after the target time $T_{TGT}$.

In example embodiments, resistance values of the program states '00', '01', '10', '11', 'REF1', 'REF2', and 'REF3' may be distinguishable at a lifetime.

In the event that a memory cell MC of the inventive concept is formed of a phase change material (GST), the probability that a resistance value converges over time may be high. In the memory cells including a phase change material (GST), a total resistance value may satisfy the following equation 2.

$$R_{Total} = R_0 \left(\frac{t}{t_0}\right)^d + R_{PARA} \quad (2)$$

In equation 2, an element $R_{RST}=R_0(t/t_0)^d$ may have a drift characteristic. The element $R_{PARA}$ may comprise a large part of the total resistance value $R_{TOTAL}$ when the write time tWTR is sufficiently short. Thus, if a conventional write and verification method is used, the difference in resistance that may occur over time may increase due to the variation in the element $R_{PARA}$. In contrast, if the write and verification methods of the inventive concept are used, the time when resistance values are overlapped may be controlled such that resistance values converge over time.

As illustrated in FIG. 4, the nonvolatile memory device 100 according to an embodiment of the inventive concept may perform a write operation such that program states '00', '01', '10', '11', 'REF1', 'REF2', and 'REF3' are varied. That is, the nonvolatile memory device 100 according to an embodiment of the inventive concept may perform a write operation such that resistance values converge until a target time $T_{TGT}$ and diverge after the target time $T_{TGT}$.

Figure 5:
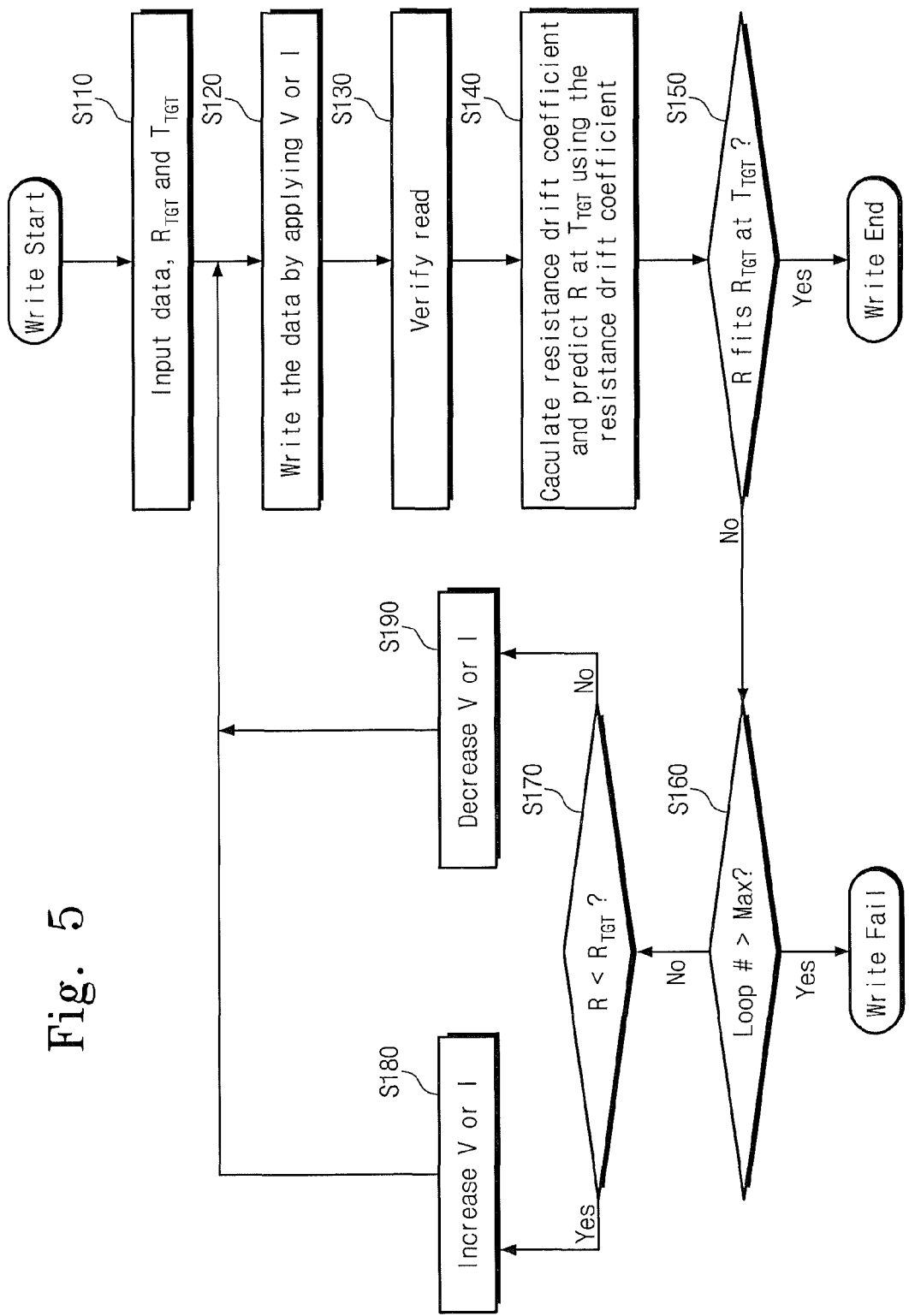
FIG. 5 is a flow chart schematically illustrating a write operation of a nonvolatile memory device according to an embodiment of the inventive concept.

FIG. 5 is a flow chart schematically illustrating a write operation of a nonvolatile memory device 100 according to an embodiment of the inventive concept. Below, a write operation of the nonvolatile memory device 100 will be more fully described with reference to FIGS. 1 to 5.

In operation S110, write data, a target resistance value $R_{TGT}$, and a target time $T_{TGT}$ may be received from an external device with a write command and an address. In operation S120, the input write data may be written to memory cells that are connected with a selected word line by applying a voltage or current corresponding to the write data to a selected bit line and a voltage or current to a word line selected by the input address. At this time, each memory cell that is connected to the selected word line may be programmed to have one of data states '00', '01', '10', and '11'. At the same time, each reference memory cell connected with the selected word line may be programmed to have one of reference resistance states REF1, REF2, and REF3.

In operation S130, verification read operations may be performed on the written memory cells at two or more different times. Different resistance values that are measured at the different times may be obtained through such verification read operations.

A resistance drift coefficient d may then be calculated using the different resistance values measured at the different times during the verification read operations, and a predicted resistance value R at the target time $T_{TGT}$ may be calculated using the resistance drift coefficient d. The resistance drift coefficient d and the predicted resistance value R may be calculated by the nonvolatile memory device 100 or by an external device such as, for example, a memory controller.

In operation S150, control logic 170 (refer to FIG. 1) may determine whether the predicted resistance value R that is predicted at the target time $T_{TGT}$ satisfies the target resistance value $R_{TGT}$. If the predicted resistance value R is not within a predetermined range around the target resistance value $R_{TGT}$, then operations may proceed to operation S160 where a determination is made as to whether or not a write loop number has reached a maximum value. If the write loop number has reached a maximum value, then operations end and the write operation is deemed to have failed. If the write loop number has not reached the maximum value, then the write loop number may be increased by 1, and the method may proceed to operation S170. In operation S170, a determination is made as to whether or not the predicted resistance value R is less than the target resistance value $R_{TGT}$.

If the predicted resistance value R is less than the target resistance value $R_{TGT}$, in operation S180, a voltage or current applied to the selected word line may increase by a predetermined level (or alternatively, may be maintained for a longer time), and the method may then proceed to operation S120. If the predicted resistance value R is more than the target resistance value $R_{TGT}$, in operation S190, a voltage or current applied to the selected word line may decrease by a predetermined level (or, alternatively, may be maintained for a shorter time), and the method may then proceed to operation S120.

If at operation S150 the predicted resistance value R is within a predetermined range of the target resistance value $R_{TGT}$, the write operation may end.

With the writing method of the inventive concept, a write loop may be executed such that a predicted resistance value R at the target time $T_{TGT}$ is within a predetermined range of the target resistance value $R_{TGT}$.

Meanwhile, the nonvolatile memory device 100 according to an embodiment of the inventive concept may be understood to perform a verification operation based on a predetermined resistance value at a write operation. This write operation will be more fully described below.

Figure 6:
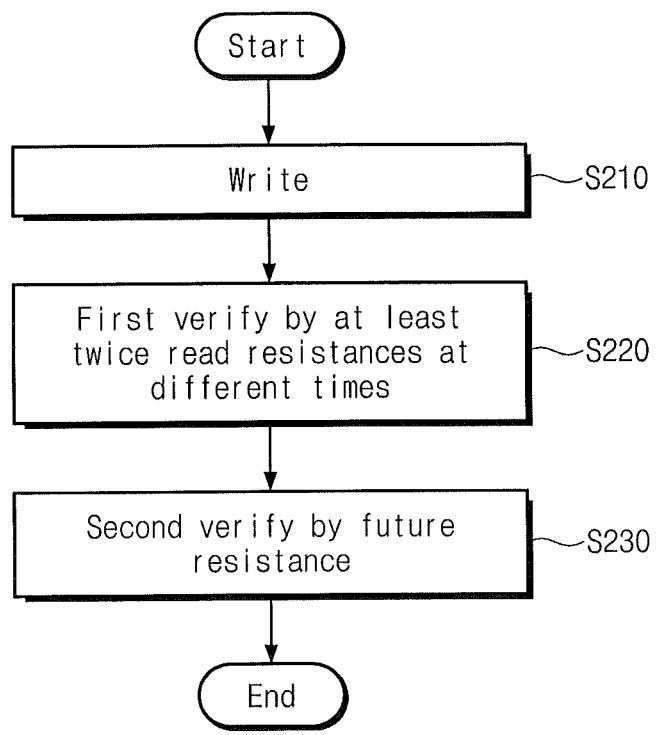
FIG. 6 is a flow chart schematically illustrating a write operation of a nonvolatile memory device according to another embodiment of the inventive concept.

FIG. 6 is a flow chart schematically illustrating a write operation of a nonvolatile memory device 100 according to another embodiment of the inventive concept. Below, a write operation of a nonvolatile memory device 100 according to another embodiment of the inventive concept will be more fully described with reference to FIGS. 4 and 6.

In operation S210, data may be written to memory cells of the memory cell array 110. In operation S220, a first verification operation may be performed in which resistance values are read at two or more different times with respect to the memory cells that the data was written to. In operation S230, a future resistance value R at a specific time (or, a target time $T_{TGT}$) may be predicted using the result of the first verification operation, and a second verification operation may be performed by determining whether the predicted resistance value R satisfies a target resistance value $R_{TGT}$.

The writing method of the nonvolatile memory device 100 according to another embodiment of the inventive concept may perform a verification operation based on a future resistance value.

In FIGS. 1 to 6, a write operation may be implemented to satisfy a target resistance value $R_{TGT}$ by adjusting a resistance drift coefficient d. However, the inventive concept is not limited thereto. For example, the write operation of the inventive concept may be implemented to satisfy a target resistance drift coefficient $d_{TGT}$ by adjusting a resistance drift coefficient.

Figure 7:
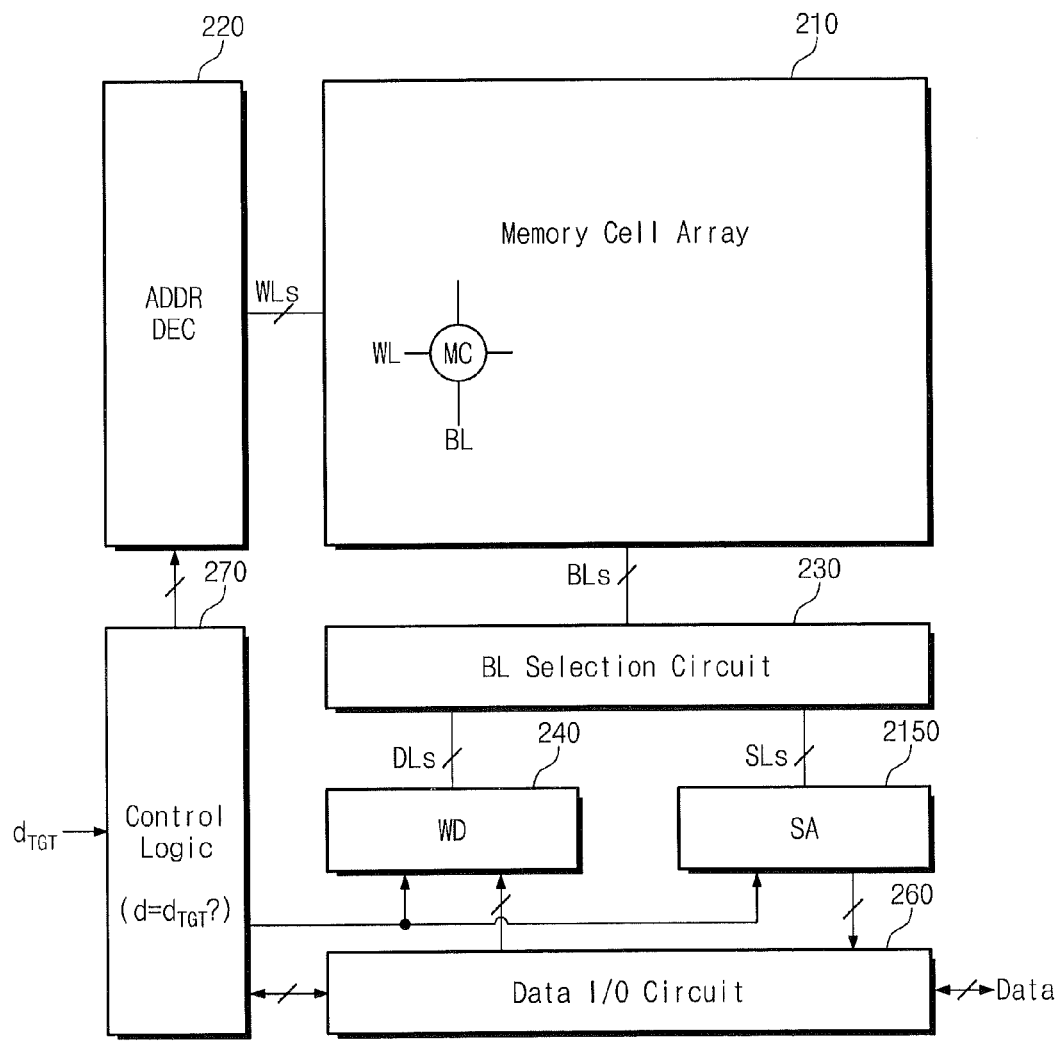
FIG. 7 is a block diagram schematically illustrating a nonvolatile memory device according to another embodiment of the inventive concept.

FIG. 7 is a block diagram schematically illustrating a nonvolatile memory device 200 according to another embodiment of the inventive concept. Referring to FIG. 7, the nonvolatile memory device 200 may include a memory cell array 210, an address decoder 220, a bit line selection circuit 230, a write driver circuit 240, a sense amplifier 250, a data input/output circuit 260, and control logic 270. The control logic 270 may receive a target resistance drift coefficient $d_{TGT}$ as opposed to receiving a target resistance value $R_{TGT}$ and a target time $T_{TGT}$ as described above in other embodiments. As part of a write operation, the control logic 270 may calculate a resistance drift coefficient d using resistance values calculated at two or more different times and determine whether the calculated resistance drift coefficient d satisfies the target resistance drift coefficient $d_{TGT}$.

Figure 8:
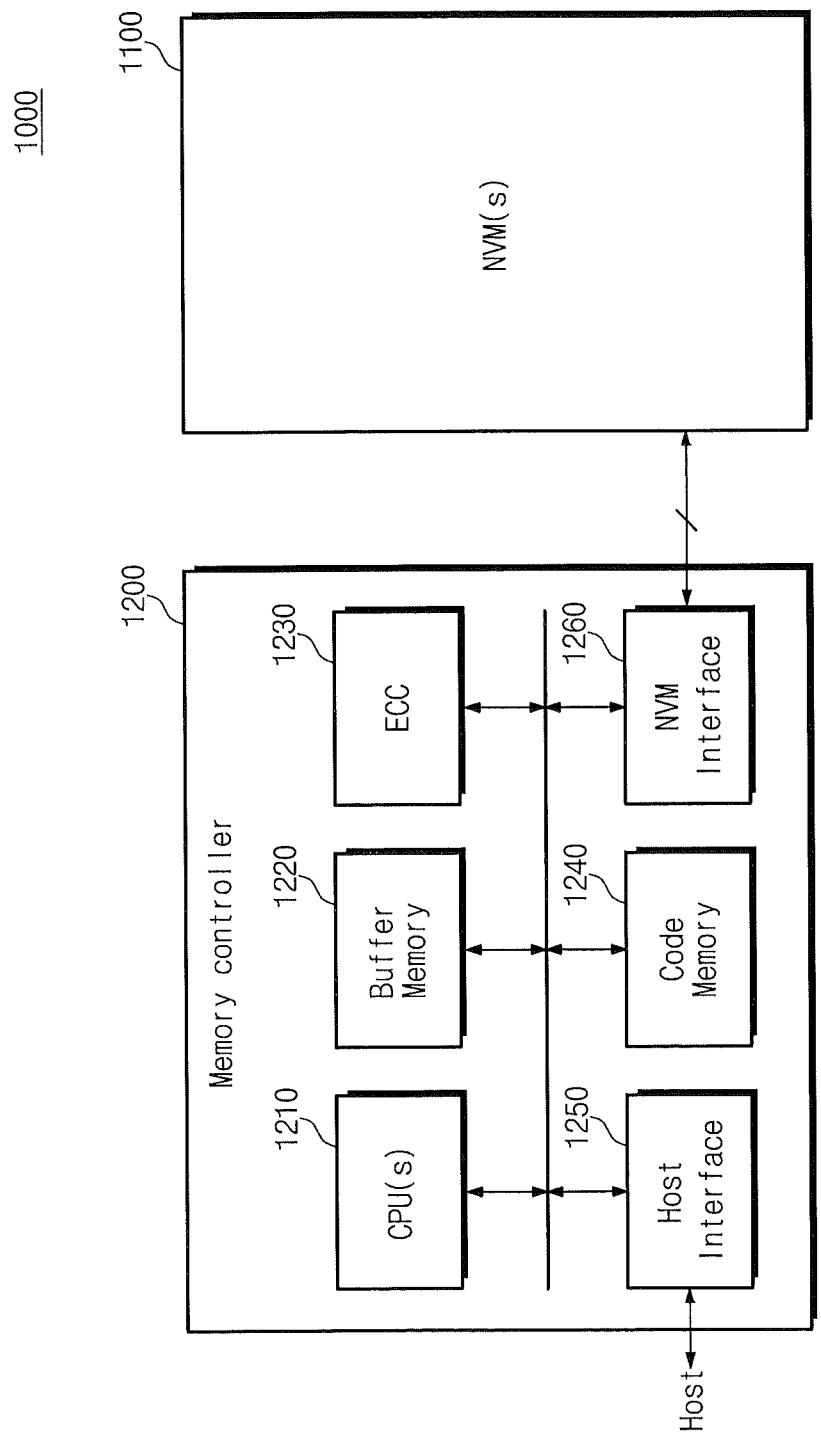
FIG. 8 is a block diagram, schematically illustrating a memory system according to embodiments of the inventive concept.

FIG. 8 is a block diagram schematically illustrating a memory system 1000 according to embodiments of the inventive concept. Referring to FIG. 8, the memory system 1000 may include at least one nonvolatile memory device 1100 and a memory controller 1200. The nonvolatile memory device 1100 may be configured to perform one of the write operations described above with reference to FIGS. 1 to 7. The memory controller 1200 may be connected to the nonvolatile memory device 1100 through a plurality of channels. The memory controller 1200 may include at least one processor 1210, a buffer memory 1220, an ECC circuit 1230, a code memory 1240, a host interface 1250, and a memory interface 1260.

The memory system 1000 according to an embodiment of the inventive concept may improve reliability of data by performing a verification operation as part of a write operation on the basis of a predicted future resistance value.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of writing data to a nonvolatile memory device, the method comprising:
   receiving the data, a target time, and a target resistance value;
   writing the data to a memory cell;
   measuring a first resistance value of the memory cell at a first time;
   measuring a second resistance value of the memory cell at a second time;
   calculating a resistance drift coefficient based on the measured first and second resistance values of the memory cell;
   calculating a predicted resistance value of the memory cell at the target time using the resistance drift coefficient; and
   determining whether the predicted resistance value satisfies the target resistance value.

2. The writing method of claim 1, wherein the memory cell includes a resistance material.

3. The writing method of claim 2, wherein the resistance value R of the memory cell satisfies the following equation:

$$R=R_0(t/t_0)^d$$

wherein $R_0$, $t_0$, t, and d indicate an initial resistance value, an initial time, a time at which the resistance value R is determined, and the resistance drift coefficient, respectively.

4. The writing method of claim 2, wherein the memory cell is a phase change memory cell.

5. The writing method of claim 4, wherein writing the data to a memory cell comprises:
   setting the resistance value of the memory cell to a first of a plurality of data states based on a value of the input data, at least one reference resistance state being used to distinguish between the plurality of data states.

6. The writing method of claim 1, wherein determining whether the predicted resistance value satisfies the target resistance value comprises:
   determining whether the predicted resistance value is within a predetermined range of the target resistance value.

7. The writing method of claim 2, further comprising:
   determining whether a write loop number reaches a maximum write loop number when the predicted resistance value does not satisfy the target resistance value.

8. The writing method of claim 7, further comprising:
   determining whether the predicted resistance value does not satisfy the target resistance value when the write loop number does not reach the maximum write loop number.

9. The writing method of claim 8, further comprising:
   decreasing a current or voltage applied to the memory cell during a subsequent programming loop for the memory cell in response to the predicted resistance value exceeding the target resistance value.

10. The writing method of claim 8, further comprising:
    increasing a current or voltage applied to the memory cell during a subsequent programming loop for the memory cell in response to the predicted resistance value being less than the target resistance value.

11. A method of programming a nonvolatile memory device, the method comprising:
measuring the resistance of a memory cell at two or more different times;
calculating a resistance drift coefficient for the memory cell based on the measured resistances; and
determining at least one of (a) whether the calculated resistance drift coefficient for the memory cell is within a first predetermined range of a target resistance drift coefficient at a first target time or (b) whether a predicted resistance value for the memory cell that is calculated using the calculated resistance drift coefficient for the memory cell is within a second predetermined range of a target resistance value at a second target time.

12. The method of claim 11, further comprising writing data to the memory cell prior to measuring the resistance of the memory cell.

13. The method of claim 11, further comprising adjusting the resistance of the memory cell if the predicted resistance value at the second target time falls outside the second predetermined range.

14. The method of claim 13, further comprising:
increasing a write voltage or current supplied to the memory cell if (a) the calculated resistance drift coefficient at the first target time exceeds the first predetermined range for the target resistance drift coefficient or (b) if the predicted resistance value at the target time exceeds the second predetermined range for the target resistance value.

15. The method of claim 13, further comprising:
decreasing a write voltage or current supplied to the memory cell if (a) the calculated resistance drift coefficient at the first target time is less than the first predetermined range for the target resistance drift coefficient or (b) if the predicted resistance value at the target time is less than the second predetermined range for the target resistance value.

16. A method of programming a nonvolatile memory device, the method comprising:
writing data to a memory cell of the nonvolatile memory device;
determining a predicted resistance value at a target time based on resistance values measured at two or more different points of time during a program verification operation;
determining that the predicted resistance value is outside a predetermined range for a target resistance value; and
adjusting a parameter of a programming voltage or current that is applied to the memory cell during a subsequent programming loop based at least in part on the determined predicted resistance value.

17. The method of claim 16, further comprising calculating a resistance drift coefficient for the memory cell based on the measured resistance value.

18. The method of claim 16, wherein the parameter of the programming voltage or current is a time for which the programming voltage or current is applied to the memory cell during the subsequent programming loop.

19. The method of claim 16, wherein the parameter of the programming voltage or current is a magnitude of the programming voltage or current that is applied to the memory cell during the subsequent programming loop.

* * * * *